United States Patent [19]

Heller et al.

[11] 4,374,189

[45] Feb. 15, 1983

[54] PROCESS OF MAKING A HOLOGRAPHIC OPTICAL ARTICLE

[75] Inventors: Carl A. Heller, China Lake; Warren J. Murbach, Sun City, both of Calif.

[73] Assignee: The United States of America as represented by the Secretary of the Navy, Washington, D.C.

[21] Appl. No.: 230,187

[22] Filed: Feb. 2, 1981

Related U.S. Application Data

[63] Continuation-in-part of Ser. No. 104,511, Dec. 17, 1979, abandoned.

[51] Int. Cl.$^3$ .............................................. G03C 5/04
[52] U.S. Cl. ............................... 430/2; 204/159.2; 350/3.61; 430/1
[58] Field of Search ................ 430/1, 2, 270, 321; 350/3.6, 3.61; 204/159.2

[56] References Cited

U.S. PATENT DOCUMENTS

| | | | |
|---|---|---|---|
| 1,658,659 | 2/1928 | Skaupy et al. | |
| 2,877,500 | 3/1959 | Rainer et al. | 264/22 |
| 2,904,480 | 9/1959 | Rainer et al. | 204/159.2 |
| 3,144,398 | 8/1964 | Rainer et al. | 204/159.2 |
| 3,658,526 | 4/1972 | Haugh | 430/2 X |
| 3,767,399 | 10/1973 | Takano et al. | 430/2 |
| 3,925,077 | 12/1975 | Lewis et al. | 430/2 X |
| 4,022,855 | 5/1977 | Hamblen | 204/159.22 |

FOREIGN PATENT DOCUMENTS

4930451 10/1970 Japan ..................................... 430/2

*Primary Examiner*—Jack P. Brammer
*Attorney, Agent, or Firm*—Robert F. Beers; W. Thom Skeer; Bruce H. Cottrell

[57] ABSTRACT

A holographic optical article of manufacture and a process for making it are made from a polymeric material in the form of film which is transparent in the infrared region and which is photochemically modified to change its index of refraction.

8 Claims, No Drawings

PROCESS OF MAKING A HOLOGRAPHIC OPTICAL ARTICLE

This is a continuation-in-part of application Ser. No. 104,511, filed Dec. 17, 1979, now abandoned.

BACKGROUND OF THE INVENTION

The infrared seeking missiles currently in use utilize irdomes of germanium and optical elements to correct aberrations introduced by the irdome. The aerodynamic shape of the irdome is limited by the optical considerations. Holographic optical elements can overcome these limitations by correcting aberrations even from aerodynamically improved irdomes.

Holographic optical elements, HOE's, can be used for many purposes including correcting elements behind missile domes, lenses, and gratings. HOE's in the visible are used for gratings and other optical elements. Similar infrared, IR, transparent HOE's are desired but have not been made previously. A phase hologram can be made in polymer film if index of refractions gradients can be formed on a scale comparable to the wavelengths of light.

The advantages of such HOE films over conventional optical elements are reduced weight and cost. Conventional infrared optics require special glass of germanium or magnesium floride which needs to be ground to the proper shape.

DESCRIPTION OF THE PRIOR ART

The use of polymer material for making holographic optical elements for use in correcting aberrations in aerodynamically improved irdomes has many advantages. Generally, the elements are much less expensive. Moreover, they are lightweight and pliable and are made from readily available polymeric materials as shown in U.S. Pat. Nos. 2,877,500 and 2,904,480. Further, U.S. Pat. No. 3,144,393 illustrates the making of a unique product by a process that shrinks the previously stretched polymeric material. These inventions illustrate the making of a transparent film or sheet that is clear and subsequently converts that into any desired shape or size as desired in supplying the market place. U.S. Pat. No. 4,022,855 further illustrates the state of the art by illustrating a centrifugal holding method for making a plastic lens having a gradient index of refraction.

SUMMARY OF THE INVENTION

The present invention comprises a holographic optical article of manufacture and a process for making it. The holographic optical article operates in the infrared region of the electromagnetic spectrum and is comprised of a polymeric material which is transparent in all or part of the infrared region and which is photochemically modified to change its index of refraction on a microscopic scale. The process for fabricating a holographic optical article of manufacture which operates in the infrared region of the electromagnetic spectrum comprises exposing the polymeric film to an ultra-violet light pattern in the presence of another chemical which can react to form a compound with a different index of refraction. If exposed in a vacuum, the photochemical reaction would consist of self-reaction or cross linking of the polymer.

The object of the invention is to produce IR transparent films and processes which can be photochemically changed into a phase hologram. These holograms, by using the correct pattern of the processing light, can be gratings, lenses or other optical elements.

An object of the invention is to develop a polymeric material which is photochemically sensitized into a holographic optical element useful in the infrared seeker of a missile, or useful for grating of infrared monochromator and spectrometers. Another object being an infrared optical element such as a lens, grating, or beamsplitter. A further object is to develop an economical process for making a polymeric material which is photochemically sensitized into holographic optical elements useful in the infrared seeker of a missile.

Other objects, advantages, and novel features of the present invention will become apparent from the following detailed description of the invention. It should be understood, however, that the detailed description and specific examples for all indicated preferred embodiments of the invention are given by way of illustration only, since various changes and modifications within the spirit and scope of the invention will become apparent to those skilled in the art. The following examples additionally illustrate typical examples of carrying out the invention.

EXAMPLE I

Polyethylene film which is not cross linked and is 0.004 inches thick (0.102 mm) is cleaned with acetone and dried. It is placed between two quartz sheets. The upper quartz sheet has a metal grating of molybdenum on it. The grating is 9 $\mu$m metal strips separated by 9 $\mu$m of window. The metalized surface is wetted with nonane to provide better optical contact and pressed against the polyethylene film. Any IR transparent liquid that wets the surface can be used. Nonane and similar hydrocarbon liquids are obvious choices to fit this criteria. The quartz-film-quartz sandwich is clamped together and exposed to light from a flat spiral, low pressure ultra-violet lamp. After 4 hours and 34 minutes of exposure, the film can be tested with a He-Ne laser to show a definite diffraction pattern which in turn shows a grating now exists in the film.

The exposed film shows new absorption due to C=O bonds. The C=O bonds apparently provide the change in index of refraction.

EXAMPLE II

Similar to Example I except that different areas of the quartz film sandwich are exposed to light for different periods of time. The times are 81 minutes, 156 minutes, and 251 minutes. The change in index of refraction, $\Delta n$, is $\Delta n = +6.3 \times 10^{-3}$. C=O bonds in the polymer appear to have a larger n than pure polyethylene. The C=O bond appears to be formed from oxygen in the air and carbon in the polyethlene. The length of exposure determined the number of C=O bonds formed.

The light used in both examples is primarily 254 nm with some 184.9 nm present in low pressure mercury lamps. Preferred temperature range for these examples is 20°–80° C.

EXAMPLE III

Bathing the film in other gases and liquids will cause different reactions. For example, acetyl iodide or methyl iodide to form iodide bonds rather than C=O bonds in the polyethlene will produce a grating with a different $\Delta n$. 254 nm light is still used with varying exposure times.

What is claimed is:

1. A method of making holographic optical devices by changing the index of refraction in selected portions of polymer material comprising the steps of:
   cleaning noncross linked polymer film with acetone;
   placing said cleaned polymer film between an upper and a lower quartz sheet;
   putting a metal grating between said polymer material and said upper quartz sheet; and
   exposing said polymer material in air by shining light of a predetermined wavelength through said metal grating and upper quartz sheet such that the duration of exposure determines the amount of change in the index of refraction that occurs in the exposed areas.

2. A method of making holographic optical devices by changing the index of refraction in selected portions of polymer material as described in claim 1 where the noncross linked polymer material is selected from the group consisting of polyethelene, polypropylene, and mixtures thereof.

3. A method of making holographic optical devices by changing the index of refraction in selected portions of polymer materials as described in claim 1 further comprising the step of wetting said metal grating with nonane prior to putting said grating between said polymer material and said upper quartz sheet to provide better optical contact with said polymer material.

4. A method of making holographic optical devices by changing the index of refraction in selected portions of polymer material as described in claim 2 further comprising the step of wetting said metal grating with nonane prior to putting said grating between said polymer material and said upper quartz sheet to provide better optical contact with said polymer material.

5. A method of making holographic optical devices by changing the index of refraction in selected portions of polymer materials as described in claim 1 except said exposure step has said polymer exposed while immersed in acetyl iodide instead of air.

6. A method of making holographic optical devices by changing the index of refraction in selected portions of polymer material as described in claim 1 except said exposure step has said polymer exposed while immersed in methyl iodide instead of air.

7. A method of making holographic optical devices by changing the index of refraction in selected portions of polymer materials as described in claim 5 further comprising the step of wetting said metal grating with nonane prior to putting said grating between said polymer material and said upper quartz sheet to provide better optical contact with said polymer material.

8. A method of making holographic optical devices by changing the index of refraction in selected portions of polymer material as described in claim 6 where the noncross linked polymer material is selected from the group consisting of polyethelene, polypropylene, and mixtures thereof.

* * * * *